(12) United States Patent
Oda (10) Patent No.: US 7,742,884 B2
(45) Date of Patent: Jun. 22, 2010

(54) SAMPLING FREQUENCY CONTROL METHOD AND PROTECTIVE RELAY

(75) Inventor: Shigetoo Oda, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 126 days.

(21) Appl. No.: 11/976,567

(22) Filed: Oct. 25, 2007

(65) Prior Publication Data

US 2008/0112102 A1 May 15, 2008

(30) Foreign Application Priority Data

Nov. 9, 2006 (JP) .............................. 2006-303716

(51) Int. Cl.
*G01R 21/00* (2006.01)
(52) U.S. Cl. ...................................... 702/60
(58) Field of Classification Search .................. 702/60, 702/117; 361/78
See application file for complete search history.

(56) References Cited

U.S. PATENT DOCUMENTS 4,686,628 A * 8/1987 Lee et al. .................... 702/117

6,985,824 B2 1/2006 Seki

FOREIGN PATENT DOCUMENTS

| JP | 61-227627 | 10/1986 |
| JP | 63-206109 | 8/1988 |
| JP | 02-013220 A | 1/1990 |
| JP | 03-230722 A | 10/1991 |
| JP | 2000-236620 | 8/2000 |

* cited by examiner

*Primary Examiner*—Tung S Lau
*Assistant Examiner*—Xiuquin Sun
(74) *Attorney, Agent, or Firm*—Buchanan Ingersoll & Rooney PC (57) ABSTRACT

A sampling frequency control method includes a difference calculating step ST1 of calculating the difference between sampled values obtained through sampling of an AC quantity of electricity of a power system at time points that are separated by a prescribed time period of the AC quantity of electricity; an effective value calculating step ST2 of calculating an effective value of the AC quantity of electricity and an effective value of the difference; a ratio calculating step ST3 of calculating the ratio K of the effective value of the difference to the effective value of the AC quantity of electricity; and a control step of controlling the sampling frequency by controlling the sampling period on the basis of the calculated ratio K so that it follows the frequency of the AC quantity of electricity.

4 Claims, 6 Drawing Sheets

SAMPLING FREQUENCY IS
FOLLOWING SYSTEM FREQUENCY

FIG. 5B

SAMPLING FREQUENCY IS NOT
FOLLOWING SYSTEM FREQUENCY

FIG. 6

SAMPLING FREQUENCY CONTROL METHOD AND PROTECTIVE RELAY

BACKGROUND OF THE INVENTION

1. Field of the Invention

The present invention relates to a sampling frequency control method which is applied to, for example, a digital protective relay for protecting a power system from a system failure on the basis of sampled values obtained by sampling an AC quantity of electricity of the power system at a prescribed sampling frequency, as well as to a protective relay in which the sampling frequency is controlled by the above sampling frequency control method.

2. Description of the Related Art

In conventional digital protective relays, a sampling frequency control for varying the sampling period so that it follows the frequency of an input AC signal is performed in the following manners. JP-A-2-13220 (FIG. 1 and a related description) discloses a technique that the period of an input AC signal is calculated on the basis of intervals of zero-cross points where the polarity of the input signal changes and the sampling period is corrected on the basis of the calculated period. JP-A-3-230722 (FIG. 1 and a related description) discloses the following technique. In a means for determining a current frequency of a power system and correcting the sampling period according to the determined frequency, zero-cross points of a voltage, for example, are stored as frequency timing and a frequency is determined by comparing current frequency timing with frequency timing obtained a prescribed time before.

In conventional digital protective relays, for example, the sampling frequency is controlled so as to correspond to an electrical angle 30° for a system frequency by calculating the system frequency on the basis of zero-cross points where the polarity of an input AC voltage changes and controlling the sampling timing of the protective relay on the basis of the calculated system frequency. There is a problem that the control may be based on calculation results including errors because zero-cross points are determined through approximation. For example, zero-cross points are determined by performing an interpolation calculation (linear approximation) on digital data obtained by AD-converting an input AC quantity of electricity (JP-A-2-13220).

SUMMARY OF THE INVENTION

The present invention has been made in view of the above circumstances in the art, and an object of the invention is therefore to make it possible to control the sampling frequency accurately so that it follows a frequency variation of an AC quantity of electricity of a power system without the need for determining zero-cross points.

One aspect of the invention provides a sampling frequency control method including the steps of calculating, with a CPU, a ratio K, to an effective value of an AC quantity of electricity of a power system, of an effective value of a difference between sampled values obtained through sampling of the AC quantity of electricity at time points that are separated by a prescribed time period which relates to a sampling period which is shorter than a period of the AC quantity of electricity and corresponds to a prescribed electrical angle; and controlling a sampling frequency by controlling the sampling period on the basis of the calculated ratio K so that it follows a frequency of the AC quantity of electricity. This method makes it possible to control the sampling frequency accurately so that it follows a frequency variation of the AC quantity of electricity of the power system without the need for determining zero-cross points.

Another aspect of the invention provides a protective relay which protects a power system from a system abnormality on the basis of sampled values obtained by sampling an AC quantity of electricity of the power system at a prescribed sampling frequency, wherein the sampling frequency is controlled by controlling a sampling period by the above sampling frequency control method. Therefore, a protective relay can be provided in which the sampling frequency can be controlled accurately to as to follow a frequency variation of an AC quantity of electricity of a power system without the need for determining zero-cross points.

The foregoing and other objects, features, aspects, and advantages of the invention will become more apparent from the following detailed description of the invention when taken in conjunction with the accompanying drawings.

DESCRIPTION OF THE PREFERRED EMBODIMENTS

First Embodiment

Figure 1:
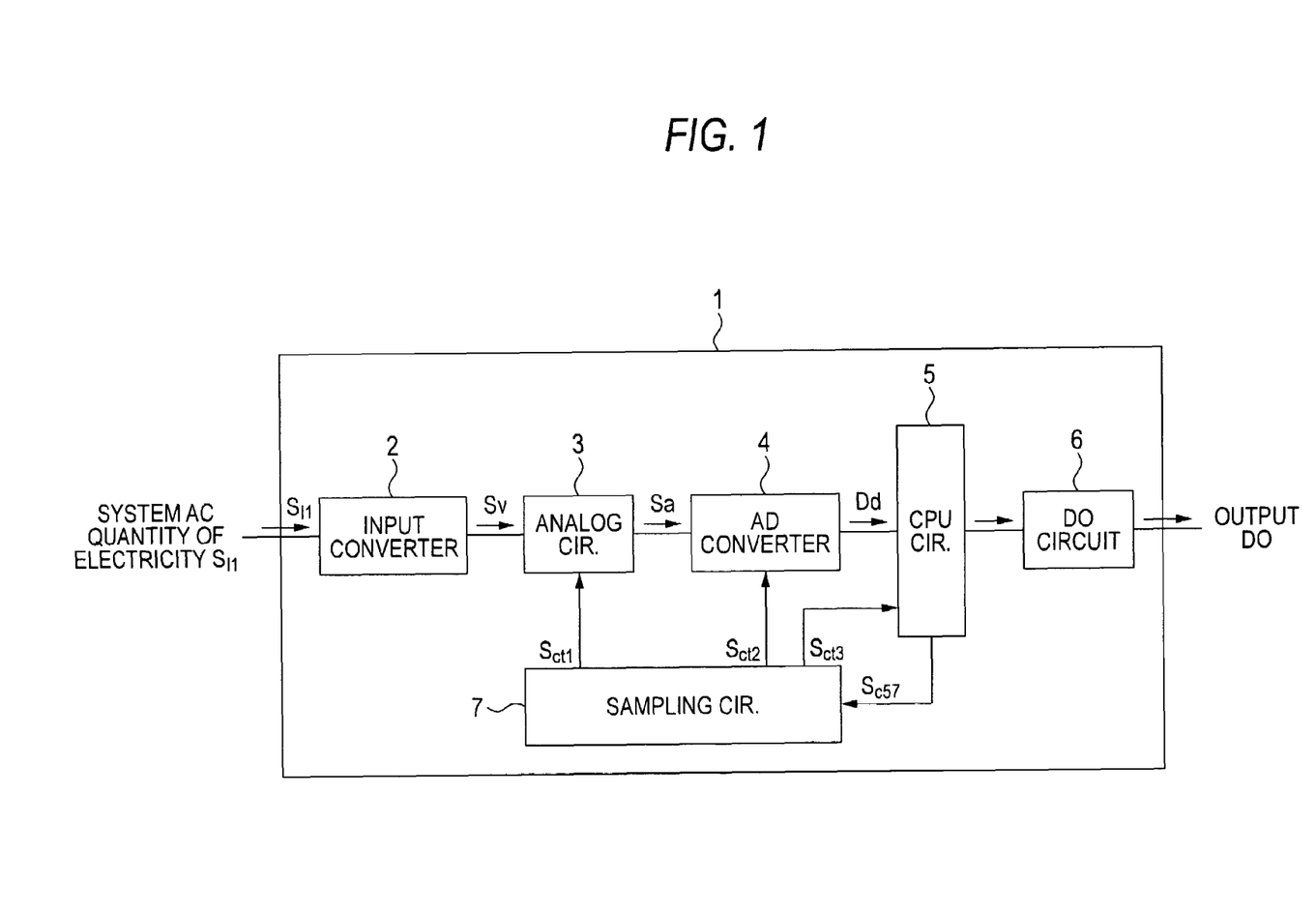
FIG. 1 is a block diagram of an exemplary protective relay having a frequency following means according to a first embodiment of the present invention.
Figure 2:
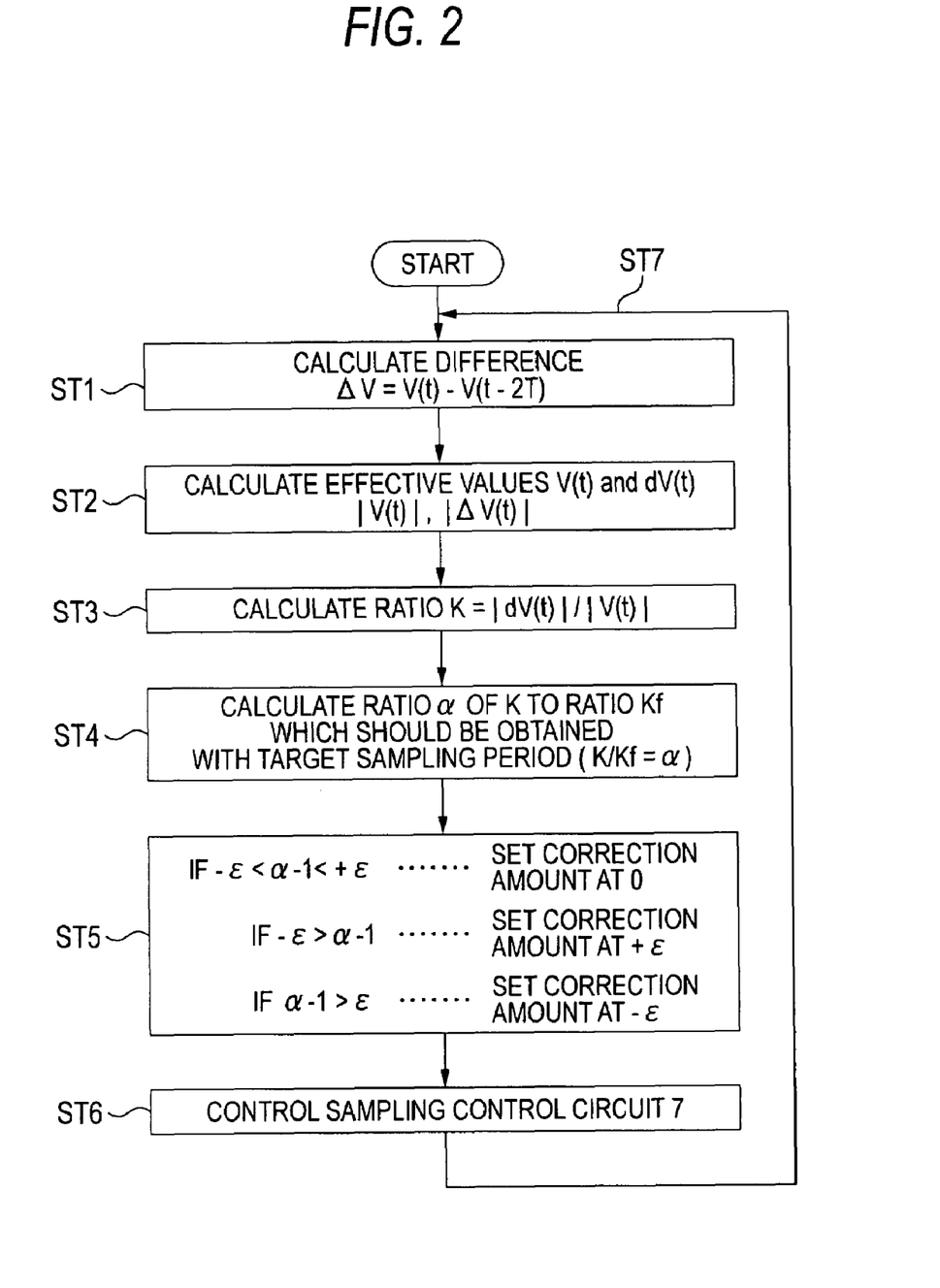
FIG. 2 is a flowchart of an exemplary operation of the frequency following means of the protective relay of FIG. 1.

A first embodiment of the present invention will be hereinafter described with reference to FIGS. 1 and 2. FIG. 1 is a block diagram of an exemplary protective relay having a frequency following means according to the first embodiment. FIG. 2 is a flowchart of an exemplary operation of the frequency following means of the protective relay.

As shown in FIG. 1, an AC quantity of electricity $S_{i1}$ such as a voltage V or a current I which is obtained from a power system via a PT or a CT is input to a protective relay 1. The input quantity of electricity $S_{i1}$ is converted by an input converter 2 into a voltage signal $S_V$ which is suitable for an analog circuit 3 (provided in the protective relay 1). The voltage signal $S_V$ is input to the analog circuit 3.

Although not shown in any drawing, as is well known, the analog circuit 3 is composed of a filter circuit for eliminating harmonic components from an AC quantity of electricity, a sample-and-hold circuit for performing AD (analog-to-digital) conversion, a multiplexer circuit for inputting plural AC quantities of electricity to an AD (analog-to-digital) converter 4 sequentially while switching between them, and other circuits. An output $S_a$ of the analog circuit 3 is input to the AD converter 4.

Digital data $D_d$ of the quantities of electricity obtained by converting the output $S_a$ of the analog circuit 3 by the AD converter 4 are sequentially input to and stored in a prescribed memory device (not shown) of a CPU circuit 5.

The CPU circuit 5 performs protective computation by digital-processing the digital data $D_d$. If the AC quantities of electricity satisfy prescribed conditions, the CPU circuit 5 outputs information to that effect via a DO (digital output) circuit 6 as an output circuit.

The sample-and-hold circuit and the multiplexer circuit in the analog circuit 3 are controlled by a control timing signal $S_{ct1}$ which is supplied from a sampling control circuit 7, and the AD converter 4 is controlled by a control timing signal $S_{ct2}$ which is also supplied from the sampling control circuit 7. A control timing signal $S_{ct3}$ which is output from the sampling control circuit 7 is a signal for causing the CPU circuit 5 to start data processing after all the AC quantities of electricity have been AD-converted and results have been stored in the prescribed memory device. The time width etc. of each of the control timing signals $S_{ct1}$, $S_{ct2}$, and $S_{ct3}$ are controlled by a control signal $S_{c57}$ which is supplied from the CPU circuit 5 to the sampling control circuit 7.

Next, an exemplary operation (steps ST1-ST7) of the protective relay 1 of FIG. 1 will be described with reference to the flowchart of FIG. 2.

Whether a system frequency is deviated from a rated frequency is checked by the following means on the basis of voltage data, for example, of AC quantities of electricity that have been input to the CPU circuit 5. The following description will be made for a case that the protective relay 1 is powered on and a sampling period (sampling timing) that is employed when a control on sampling of an input AC quantity of electricity is started (i.e., before the sampling control) is set so as to correspond to an electrical angle 30° for the rated frequency.

Step ST1: A difference (variation) dV(t) between inputs V(t) and V(t−2T) that are obtained with a prescribed time interval (corresponds to an electrical angle 60° for a frequency that is currently recognized by the protective relay 1 (before the start of a control, it is the rated frequency)) is calculated:

$$dV(t)=V(t)-V(t-2T)$$

where T is a time corresponding to an electrical angle 30° (current sampling period).

Step ST2: Effective values of V(t) and dV(t) are calculated. For example, amplitude values that are $\sqrt{2}$ times effective values are calculated according to the following equations:

$$|V(t)|^2 = V(t) \cdot V(t-6T) - V(t-3T) \cdot V(t-3T)$$

$$|dV(t)|^2 = dV(t) \cdot dV(t-6T) - dV(t-3T) \cdot dV(t-3T)$$

where |v(t)| and |dV(t)| are the amplitudes of V(t) and dV(t), respectively.

Step ST3: The ratio K of |dV(t)| to |V(t)|, that is, K=|dV(t)|/|V(t)|, is calculated. The equations used for calculating effective values at step ST2 should be such that the ratio K is kept constant, that is, does not vary depending on the calculation phase (calculation timing) of the AC quantity of electricity, even if the frequency is deviated.

One set of equations with which the ratio K is kept constant even if the frequency is deviated is disclosed in JP-A-1-227613, for example. The equations that are used above for calculating effective values at step ST2 are shown in FIG. 2(H) of this reference. According to this method, $$|V(t)|^2 = V(t) \cdot V(t-6T) - V(t-3T) \cdot V(t-3T)$$

$$= (\sin 3T) \cdot (\sin 3T) \cdot V^2$$

where V is the amplitude of the AC quantity of electricity V(t) The angle 3T of sin 3T is equal to an electrical angle 90° if the sampling period correctly corresponds to an electrical angle 30° of the input AC quantity of electricity. However, if the frequency is varied, the angle 3T is deviated from 90° according to the frequency variation. Since this deviation is independent of the calculation phase, K=|dV(t)|/|V(t)| is kept constant independently of the calculation timing.

Step ST4: The ratio K is compared with the ratio Kf of an effective value |dV(t)| to an effective value |V(t)| in which |dV(t)| and |V(t)| should be obtained in the case where the sampling period corresponds to the electrical angle (in this example, 60°) that was used in calculating the variation at step ST1.

In this example, since the electrical angle is equal to 60°, the effective values |dV(t)| and |V(t)| are identical and hence the ratio Kf=|dV(t)|/|V(t)| is equal to 1. That is, the ratio K/Kf is equal to 1 if the sampling frequency is following the system frequency correctly.

Step ST5: A correction amount is determined on the basis of α=K/Kf.

If −ε≦α−1≦ε, the current signals that are output from the sampling control circuit 7 are maintained with an understanding that the sampling period is following the system frequency almost correctly.

If α−1<−ε, the sampling period is increased by one unit correction amount so that the current sampling period comes to correspond to the required electrical angle (in this example, 60°) correctly.

If α−1>ε, the sampling period is decreased by one unit correction amount so that the current sampling period comes to correspond to the required electrical angle correctly.

The parameter ε is set equal to one unit correction amount for the sampling period. If ε is set at 0.01% (0.0001), in this example, 0.01% (0.2778 μs) of a time 2.7778 ms which corresponds to the electrical angle 60° for 60 Hz is one unit correction amount for the time 2T. If an error of 0.2778 μs occurs in the sampling whose period corresponds to 60°, a deviation in terms of electrical angle that occurs after a lapse of one second is calculated as 60 (frequency)×6 (the number of times of sampling in one cycle in the case where the period corresponds to the electrical angle 60°)×0.2778 μs/16.667 ms (1-cycle time of 60 Hz)×360°=2.17°. That is, an error of one unit correction amount causes an error of an electrical angle 4.34° after a lapse of one second. In the case of a protective element which operates on the basis of a variation in the AC quantity of electricity due to a failure, a difference from data obtained before a failure is always necessary during the failure. During that period of time, the error of the sampling period should be made as small as possible. If it is assumed that the maximum system failure continuation time is one second, the deviation of the sampling period occurring in that time period is 5° or less and hence the frequency can be controlled at such a level as not cause any problem in the protective computation. The value of should be determined according to a computation algorithm of the protective element and the above-mentioned value is just a value for reference.

Step ST6: The control timing signals $S_{ct1}$, $S_{ct2}$, and $S_{ct3}$ of the sampling control circuit 7 shown in FIG. 1 are corrected (or not corrected) by the above-determined correction amount in each case of step ST5, and corrected versions of the control timing signals $S_{ct1}$, $S_{ct2}$, and $S_{ct3}$ are output.

Step ST7: The process returns to step ST1 to perform steps ST1-ST6 again.

As described above, in the protective relay 1 according to this embodiment, whether the sampling frequency is following the system frequency is judged on the basis of the ratio of the effective value of a variation, in the prescribed time, of the input AC quantity of electricity to an effective value of the input AC quantity of electricity. If a deviation is found, the sampling period is controlled so as to follow the system frequency. Therefore, unlike in the conventional method in which a correction is made on the basis of zero-cross points of an input AC quantity of electricity, no hardware for measuring zero-cross points accurately is necessary and the sampling period can be corrected so as to follow the system frequency with high accuracy.

Second Embodiment

Figure 3:
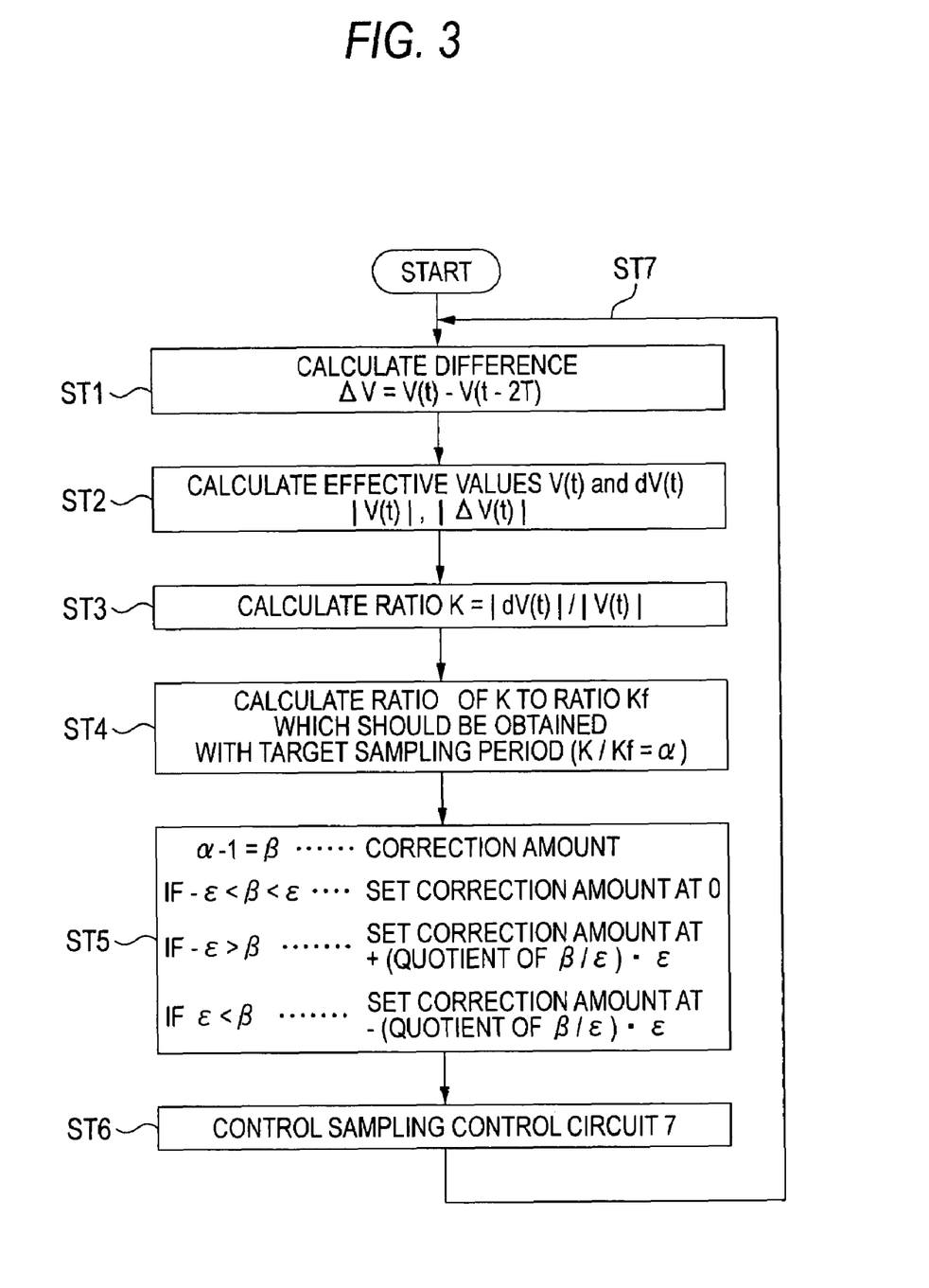
FIG. 3 is a flowchart of another exemplary operation, according to a second embodiment of the invention, of the frequency following means of the protective relay.

Another operation of the frequency following means of the protective relay 1 according to a second embodiment of the invention will be described below with reference to a flowchart of FIG. 3.

In the above-described first embodiment, the sampling period is corrected by one unit correction amount in each set of steps ST1-ST6. In contrast, in the second embodiment, as shown in FIG. 3, at step ST5, a deviation of the sampling frequency from the system frequency of the input AC quantity of electricity is calculated on the basis of the ratio α=K/Kf that was calculated at step ST4 and a correction amount is calculated instantaneously. At step ST6, a correction is made by the thus-determined correction amount. Let the correction amount be represented by the ratio to the time 2T for the rated frequency. If one unit correction amount is represented by ϵ, the quotient of (α−1)/ϵ is a multiple of the one unit correction amount. Therefore, a correction is made by the quotient of (α−1)/ϵ multiplied by ϵ. This procedure provides an advantage that the frequency following can be performed without delay.

The first embodiment employs the method in which a correction is made by one unit correction amount in each loop, and the second embodiment employs the method in which a full correction is made quickly by a necessary correction amount in one loop. Another method is possible in which n unit correction amounts are employed if the necessary correction amount is larger than or equal to n units and one unit correction amount is employed if the necessary correction amount is smaller than n units. In this case, when the necessary correction amount is relatively large, a large correction amount is employed to increase the follow speed. When the necessary correction amount is small, control is performed slowly by employing one unit correction amount at a time to secure high control accuracy. That is, this method can attain both of the high-speed followability of the second embodiment and the slow, high-accuracy followability of the first embodiment.

Third Embodiment

Each of the first and second embodiments is provided with the means for causing the sampling frequency to follow the frequency of a system AC quantity of electricity. In contrast, a third embodiment is characterized in being provided with a means for measuring a frequency of an input AC quantity of electricity from a correction amount.

Figure 4:
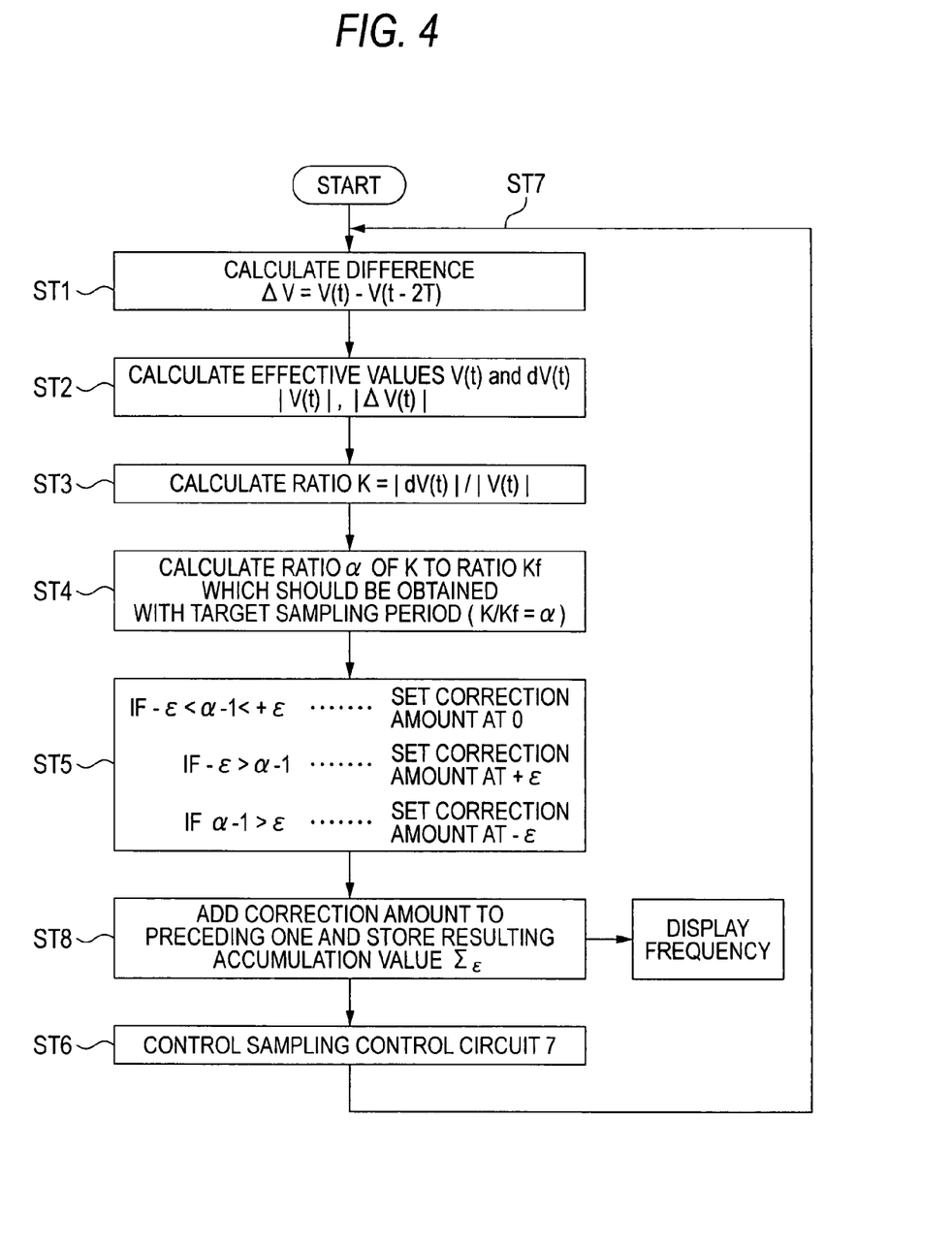
FIG. 4 is a flowchart of still another exemplary operation, according to a third embodiment of the invention, of the frequency following means of the protective relay.
Figure 5A:
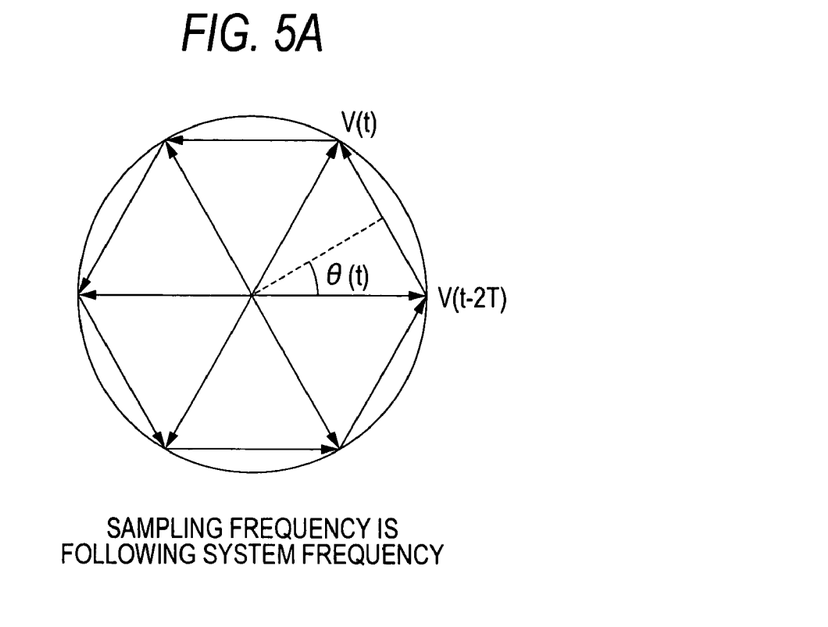
FIGS. 5A and 5B illustrate frequency computation according to the third embodiment of the invention.
Figure 5B:
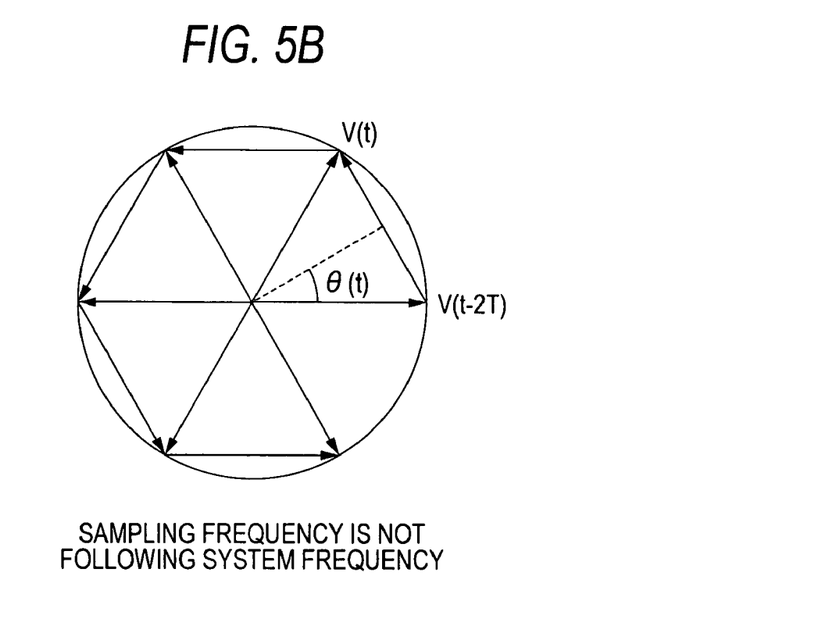

The third embodiment of the invention will be described below in a specific manner with reference to FIGS. 4 and 5. FIG. 4 is a flowchart of still another exemplary operation of the frequency following means of the protective relay 1. FIGS. 5A and 5B illustrate frequency computation.

As shown in FIG. 4, immediately after the protective relay 1 is powered on and computation is started, the sampling period is set at a value corresponding to an electrical angle for a system rated frequency.

If the frequency of an input quantity of electricity is deviated from the rated frequency, the sampling period is caused to follow the frequency of the input quantity of electricity by the means according to the first or second embodiment. A correction amount determined at step ST5 is stored.

Accumulated correction amounts are determined until the necessary correction amount becomes zero. A frequency is calculated on the basis of the final accumulated correction amount according to the following equation:

$$\theta(t)=\sin^{-1}\{(1+\Sigma\epsilon)/2\}$$

where θ(t) is the phase angle corresponding to a difference and Σϵ is the total correction amount that is necessary until the sampling frequency comes to follow the frequency of the input quantity of electricity starting from the value for the rated frequency.

Therefore, 1+Σϵ corresponds to a ratio to the effective value of a difference that should be obtained in the case where sampling is performed at the rated frequency. Therefore, θ(t) is a mutual phase angle between the difference-calculated values of the quantity of electricity (see FIGS. 5A and 5B). A quantity Δθ which is the integral of the deviation of θ(t) over one cycle becomes 360° (see FIG. 5A) if the mutual phase angle is equal to an electrical angle 60°. However, if the frequency of the input quantity of electricity is deviated from the rated frequency (see FIG. 5B), a deviation in electrical angle, Δθ, is given by the following equation:

$$\Delta\theta=360°-2\cdot(360°/60°)\cdot\theta(t).$$

A frequency f can be calculated from Δθ according to the following equation:

$$f=fs\cdot(1-\Delta\theta/360°)=fs\cdot(\theta(t)/30°)$$

where fs is the rated frequency.

As described above, a frequency can be calculated with high accuracy by software computation on the basis of a total correction amount, that is, a correction amount that is necessary for correction from a sampling period corresponding to an electrical angle that is based on the rated frequency to a sampling period for the system frequency.

Fourth Embodiment

In the first and second embodiments, the sampling control is performed so that the system frequency is always followed. However, in practice, a system failure or the like may cause a frequency variation or a phase variation in an AC quantity of electricity. This results in a problem; for example, the difference dV(t) in steps ST1 and ST2 is influenced by the failure and does not correctly reflect the AC quantity of electricity having the system frequency or necessary computation accuracy cannot be secured because of reduction in input power. In such a case (i.e., in the case of a system failure), it may be necessary to stop the frequency control.

Figure 6:
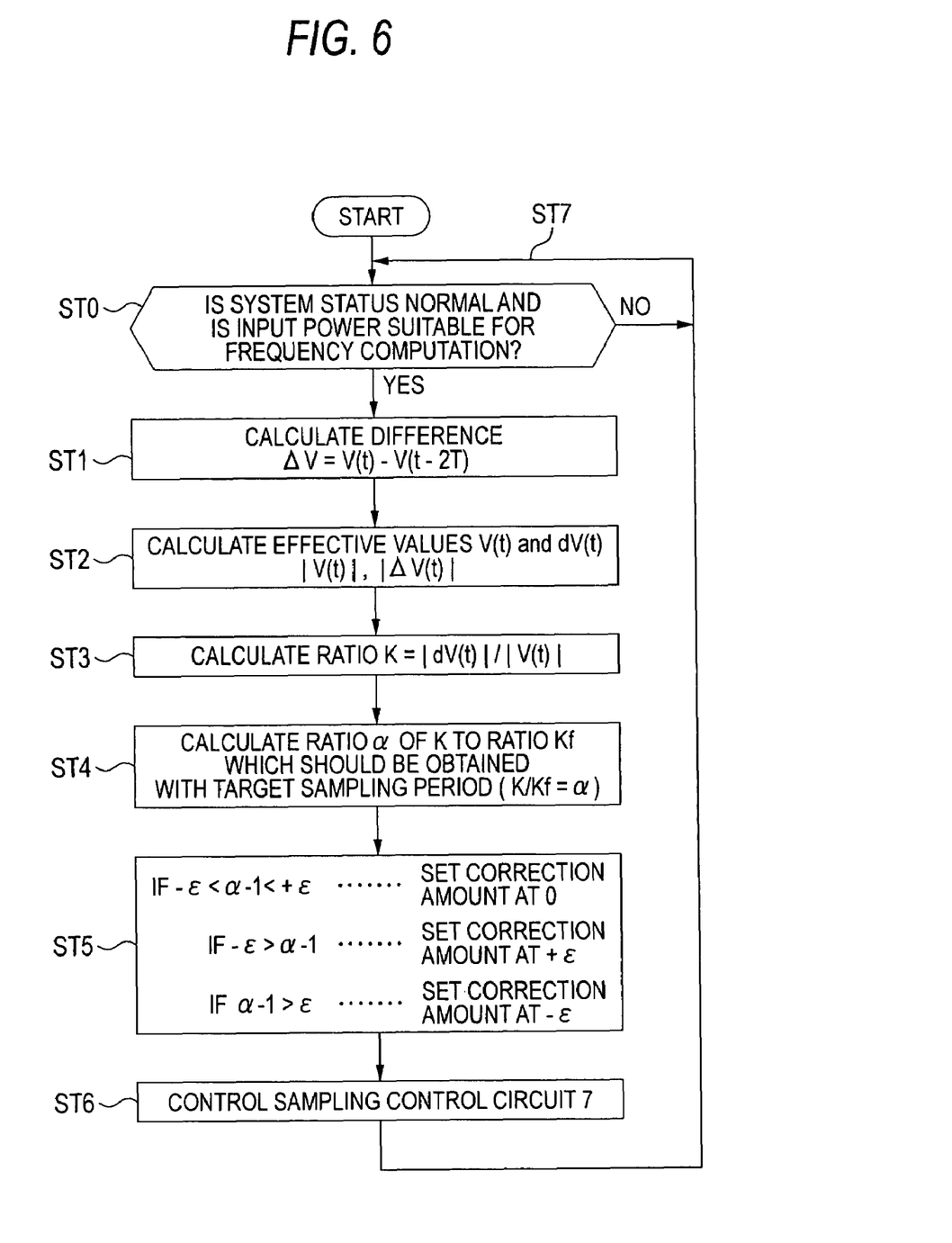
FIG. 6 is a flowchart of a further exemplary operation, according to a fourth embodiment of the invention, of the frequency following means of the protective relay.

As shown in FIG. 6, a fourth embodiment is provided with a means for judging whether the system status is normal or not (step ST0). If the system status is normal, the above-described sampling control is performed. If the system status is abnormal, the route of the sampling control is skipped temporarily, whereby the sampling period is kept at a value that was employed immediately before a stop of the sampling control. Whether the system status is normal is judged by a failure detecting element, a means for detecting an abnormal AC quantity of electricity (e.g., an input voltage having a distorted waveform), or a like means. As such, the fourth embodiment provides an advantage that frequency following is not performed erroneously by using an abnormal quantity of electricity that occurs at the time of a system abnormality.

Fifth Embodiment

Whereas the first embodiment employs the electrical angle 60° as the prescribed time for the variation computation at step ST1, variation computation can be performed in a similar manner even with a time corresponding to an electrical angle 30° or some other angle.

Where an electrical angle 30° is employed, steps ST1-ST5 are changed as follows:

Step ST1: $dV(t)=V(t)-V(t-T)$ where T is a time corresponding to an electrical angle 30° (current sampling period).

Step ST2: Effective values of V(t) and dV(t) are calculated according to the following exemplary equations:

$$|V(t)|^2 = V(t) \cdot V(t-6T) - V(t-3T) \cdot V(t-3T)$$

$$|dV(t)|^2 = dV(t) \cdot dV(t-6T) - dV(t-3T) \cdot dV(t-3T)$$

where |V(t)| and |dV(t)| are the effective values of V(t) and dV(t), respectively.

Step ST3: The ratio K of |dV(t)| to |V(t)|, that is, K=|dV(t)|/|V(t)|, is calculated.

Step ST4: The ratio K is compared with the ratio Kf of an effective value |dV(t)| to an effective value |V(t)| in which |dV(t)| and |V(t)| should be obtained in the case where the sampling period corresponds to the electrical angle (in this example, 30°) that was used in calculating the variation at step ST1.

In this example, since the electrical angle is equal to 30°, a relationship $|dV(t)|=2\cdot(\sin 15°)\cdot|V(t)|$ holds and the ratio Kf is equal to 2·sin 15°. The ratio K/Kf is equal to 1 if the sampling frequency is following the system frequency correctly.

Step ST5: A correction amount is determined on the basis of $\alpha=K/Kf$.

If $-\epsilon \leq \alpha-1 \leq \epsilon$, the sampling frequency is following the system frequency.

If $\alpha-1 < -\epsilon$, the sampling period is increased by one unit correction amount so that the current sampling period comes to correspond to the required electrical angle correctly.

If $\alpha-1 > \epsilon$, the sampling period is decreased by one unit correction amount so that the current sampling period comes to correspond to the required electrical angle correctly.

By employing, as described above, the electrical angle 30° as the one corresponding the time for calculation of a difference, the computation cycle of steps ST1-ST6 can be made equal to a time corresponding to 30° in the minimum case, which provides an advantage that the followability can be increased further.

Conversely, if the computation of sampling correction amounts is an unduly heavy load on the protective relay 1 in terms of the CPU processing ability of the CPU circuit 5 (see FIG. 1), it is possible to employ an electrical angle 90° or 180° to secure a sufficient processing time for the CPU control.

In the case of 90°, Kf=|dV(t)|/|V(t)| becomes 2·sin 45°. In the case of 180°, Kf=|dV(t)|/|V(t)| becomes 2. In either case, K/Kf is equal to 1 if the sampling frequency is following the system frequency.

As described above, sampling correction amounts for frequency following can likewise be determined even in the case where an electrical angle other than 60° which is employed in the first to fourth embodiments is employed.

In FIGS. 1-4 and 6, the same or equivalent components or steps are denoted by the same reference symbol.

Each of the above embodiments is directed to the control on the sampling frequency of the analog-to-digital conversion in the digital protective relay which performs protective relay computation by converting an AC quantity of electricity of the protective relay into digital data. However, the concept of each of the above embodiments can also be applied to a sampling frequency control method for power systems other than protective relays.

Features of the above embodiments will be pointed out below.

Feature 1: For example, the difference between current digital data and digital data obtained a predetermined time before is determined on the basis of digital data (instantaneous values) obtained by AD-converting an input AC quantity of electricity (the predetermined time relates to the sampling period). An error of the thus-determined difference from the difference between digital data that should be obtained in the case where the sampling period corresponds to the correct electrical angle is measured. The sampling frequency is controlled so that the error becomes zero.

Feature 2: The sampling frequency control means is provided with the means for calculating the ratio of the effective value of the difference (variation) between instantaneous values obtained from digital data of the input AC quantity of electricity at time points that are separated by a prescribed time to an effective value of the input AC quantity of electricity obtained at a time point that is close to the above time points, and measuring the difference between the calculated ratio and the ratio between like effective values that should be obtained in the case where the sampling is performed at a required, correct sampling period. The prescribed time which determines the sampling period is controlled so that the difference becomes zero.

Feature 3: The frequency calculating means is provided which can calculate a frequency of the input AC quantity of electricity on the basis of a correction amount for the sampling period.

Feature 4: Even if the system frequency is deviated from the rated frequency, the protective relay having the sampling frequency control means can perform sampling at a sampling period that corresponds to an electrical angle which follows the system frequency. Therefore, the sampling frequency follows the system frequency correctly in the input variation width detecting element for detecting an input variation over a certain time (e.g., a time corresponding to an n-cycle period for the system frequency, where n is a positive integer), that is, $|dV(t)|=|V(t)-V(t-(n\text{-cycle time}))|$, where |dV(t)| is the absolute value of dV(t). Therefore, V(t)−V(t−(n-cycle time)) which is n-cycle preceding data can be acquired easily without an error, and the absolute value of a input variation, |dV(t)|, can be calculated without producing an error. In this manner, data can be obtained in the protective element for comparison with past data. Or data at a time point that precedes the current time by an electrical angle for the system frequency can be obtained in the effective value calculation etc. This realizes calculation of the protective element which is free of errors even if a variation occurs in the system frequency. That is, causing the sampling frequency to follow the system frequency improves the frequency variation characteristic of the protective element.

Feature 5: In this method, the sampling frequency follows the frequency of the input AC quantity of electricity. A system frequency can be determined on the basis of a total (accumulated) correction amount by providing the means for storing a sampling period before the start of a follow control and a total (accumulated) correction amount after the start of the follow control.

Feature 6: The digital protective relay which has the means for receiving an AC quantity of electricity from a power system via a CT or a PT and in which the CPU circuit performs computation on digital values obtained by AD-converting the AC quantity of electricity at a prescribed sampling frequency is provided with the difference calculating means for calculating the difference between sampled values of the AC quantity of electricity, the means for calculating an effective value of the AC quantity of electricity and the effective value of the difference, the means for calculating the ratio between the effective values, and the control means for controlling the period of the sampling frequency on the basis of the calculated ratio.

Feature 7: In the protective relay of feature 6 having the means for starting sampling at a sampling frequency that is based on the system frequency when the protective relay is powered on and for causing the sampling frequency to follow a frequency variation in the AC quantity of electricity, the means is provided which measures a frequency on the basis of a total correction amount for the sampling period after application of power.

Feature 8: The protective relay of feature 6 is further provided with the element for detecting an abnormality in the power system, and the means for performing a sampling frequency control if the power system is normal, and, if an abnormality has occurred in the power system, stopping the sampling frequency control and sampling the AC quantity of electricity at a sampling frequency that was employed before the occurrence of the abnormality.

Feature 9: The sampling frequency control method comprises the steps of calculating, with the CPU, the ratio K, to an effective value of the AC quantity of electricity of the power system, of an effective value of the difference between sampled values obtained through sampling of the AC quantity of electricity at time points that are separated by a prescribed time period which relates to a sampling period which is shorter than the period of the AC quantity of electricity and corresponds to a prescribed electrical angle; and controlling the sampling frequency by controlling the sampling period on the basis of the calculated ratio K so that it follows the frequency of the AC quantity of electricity.

Feature 10: The sampling frequency control method comprises the difference calculating step of calculating the difference between sampled values obtained through sampling of the AC quantity of electricity of the power system at time points that are separated by a prescribed time period of the AC quantity of electricity; the effective value calculating step of calculating an effective value of the AC quantity of electricity and an effective value of the difference; the ratio calculating step of calculating the ratio K of the effective value of the difference to the effective value of the AC quantity of electricity; and the control step of controlling the sampling frequency by controlling the sampling period on the basis of the calculated ratio K so that it follows the frequency of the AC quantity of electricity.

Feature 11: In the protective relay which protects a power system from a system abnormality on the basis of sampled values obtained by sampling the AC quantity of electricity of the power system at a prescribed sampling frequency, the sampling frequency is controlled by controlling the sampling period by the sampling frequency control method of feature 9 or 10.

Feature 12: In the protective relay of feature 11, the means is provided which measures a frequency on the basis of a total correction amount of the sampling period after application of power.

Feature 13: In the protective relay according to feature 11, a sampling frequency control is performed according to the above sampling frequency control method if the power system is normal, and, if an abnormality has occurred in the power system, the sampling frequency control according to the above sampling frequency control method is stopped and the AC quantity of electricity is sampled at a sampling frequency that was employed before the occurrence of the abnormality.

Although the preferred embodiments have been described above, the invention is not limited to those embodiments. And various modifications and alterations will be apparent to those skilled in the art without departing from the spirit and scope of the invention.

What is claimed is:

1. A sampling frequency control method comprising the steps of:
    calculating, with a CPU, a ratio K of an effective value of a difference between sampled values obtained through sampling of AC quantity of electricity at time points that are separated by a prescribed time period to an effective value of the AC quantity of electricity of a power system, wherein the prescribed time period relates to a sampling period which is shorter than a period of the AC quantity of electricity and corresponds to a prescribed electrical angle; and
    controlling a sampling frequency by controlling the sampling period on the basis of the calculated ratio K so that it follows a frequency of the AC quantity of electricity.

2. A protective relay which protects a power system from a system abnormality on the basis of sampled values obtained by sampling an AC quantity of electricity of the power system at a prescribed sampling frequency, wherein the sampling frequency is controlled by controlling a sampling period by the sampling frequency control method according to claim 1.

3. The protective relay according to claim 2, comprising means for measuring a frequency on the basis of a total correction amount of the sampling period after application of power.

4. A protective relay which protects a rower system from a system abnormality on the basis of sampled values obtained by sampling an AC quantity of electricity of the rower system at a prescribed sampling frequency, wherein the sampling frequency is controlled by controlling a sampling period by the sampling frequency control method comprising the steps of:
    calculating, with a CPU, a ratio K of an effective value of a difference between sampled values obtained through sampling of an AC quantity of electricity at time points that are separated by a prescribed time period to an effective value of the AC quantity of electricity of a power system, wherein the prescribed time period relates to a sampling period which is shorter than a period of the AC quantity of electricity and corresponds to a prescribed electrical angle; and
    controlling a sampling frequency by controlling the sampling period on the basis of the calculated ratio K so that it follows a frequency of the AC quantity of electricity, wherein controlling the sampling frequency is performed according to the sampling frequency control method if the power system is normal, and, if an abnormality has occurred in the power system, the sampling frequency control according to the sampling frequency control method is stopped and the AC quantity of electricity is sampled at a sampling frequency that was employed before the occurrence of the abnormality.

* * * * *